United States Patent
Lee et al.

(10) Patent No.: US 9,852,936 B2
(45) Date of Patent: Dec. 26, 2017

(54) LOAD PORT AND METHOD FOR LOADING AND UNLOADING CASSETTE

(71) Applicant: TAIWAN SEMICONDUCTOR MANUFACTURING CO., LTD., Hsinchu (TW)

(72) Inventors: Chien-Fa Lee, Hsinchu (TW); Hsu-Shui Liu, Taoyuan (TW); Jiun-Rong Pai, Jhubei (TW); Shou-Wen Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 246 days.

(21) Appl. No.: 14/609,038

(22) Filed: Jan. 29, 2015

(65) Prior Publication Data
US 2016/0225649 A1 Aug. 4, 2016

(51) Int. Cl.
*H01L 21/677* (2006.01)
*B65G 1/137* (2006.01)

(52) U.S. Cl.
CPC ........ *H01L 21/67775* (2013.01); *B65G 1/137* (2013.01); *H01L 21/67769* (2013.01)

(58) Field of Classification Search
CPC .......... B65G 1/137; B65G 1/026; B65G 1/06; B65G 1/10; B65G 1/127; H01L 21/67775; H01L 21/67769; H01L 21/67766; H01L 21/67772; H01L 21/67778
USPC ...... 414/240, 236, 237, 331.16, 331.04, 940
See application file for complete search history.

(56) References Cited

U.S. PATENT DOCUMENTS

| | | | | |
|---|---|---|---|---|
| 5,301,700 A * | 4/1994 | Kamikawa | .............. | B08B 3/022 134/102.3 |
| 6,050,768 A * | 4/2000 | Iwasaki | ............. | H01L 21/67276 414/222.01 |
| 6,220,808 B1 * | 4/2001 | Bonora | ............. | H01L 21/67772 414/217 |
| 6,247,245 B1 * | 6/2001 | Ishii | .................. | H01L 21/67757 34/210 |
| 6,663,332 B1 * | 12/2003 | Sluijk | ............... | H01L 21/67769 414/160 |
| 6,942,738 B1 * | 9/2005 | Nelson | ............... | H01L 21/67754 134/33 |
| 7,278,813 B2 * | 10/2007 | Davis | ................ | H01L 21/67769 414/416.03 |
| 8,596,947 B1 * | 12/2013 | Stenzel | ..................... | B64F 1/32 414/331.04 |

(Continued)

*Primary Examiner* — Glenn Myers
(74) *Attorney, Agent, or Firm* — Maschoff Brennan (57) ABSTRACT

A load port for a processing tool includes a carrier, a carrier actuator, an input table, an input table actuator, and a controller. The carrier has a plurality of cassette buffering spaces. The carrier is movable relative to the processing tool. The carrier actuator is operably connected to the carrier. The input table is configured to receive at least one cassette. The input table is movable relative to the carrier. The input table actuator is operably connected to the input table. The controller is configured to control the carrier actuator to move the carrier, such that one of the cassette buffering spaces is aligned with the input table, configured to control the input table actuator to move the input table with the cassette into the aligned cassette buffering space, and configured to control the input table to load the cassette into the aligned cassette buffering space.

20 Claims, 8 Drawing Sheets

(56) References Cited

U.S. PATENT DOCUMENTS

| | | | |
|---|---|---|---|
| 8,851,819 B2 * | 10/2014 | Kamikawa | H01L 21/67727 414/222.07 |
| 2009/0022575 A1 * | 1/2009 | Tsuge | H01L 21/67769 414/679 |
| 2012/0186192 A1 * | 7/2012 | Toebes | B65G 1/04 53/235 |

* cited by examiner

Fig. 8

LOAD PORT AND METHOD FOR LOADING AND UNLOADING CASSETTE

BACKGROUND

In the manufacturing of a semiconductor device, the device is usually processed at many work stations or processing machines. The transporting or conveying of a partially finished device, or a work-in-process (WIP) part, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e. as many as several hundred, is usually required to complete the fabrication process. A semiconductor wafer or IC chips must be stored or transported between various process stations in order to perform various fabrication processes.

A load port is used to handle not only semiconductor wafers but also different types of substrate to be processed such as liquid crystal display glass substrates and photomask glass substrates. Further, as a processing tool to which the substrate to be processed is transferred, various processing tools such as a manufacturing apparatus, visual inspection apparatus, electrical characteristic test apparatus are provided.

Recently, in order to enhance the manufacturing yield in a semiconductor manufacturing process, the diameter of wafers has increased and wafers with a diameter of 300 mm are used in addition to wafers with a diameter of 200 mm. Plural types of cassette are provided to receive substrates such as wafers. As some of the types of the cassette, cassettes for wafers with a diameter of 200 mm and cassettes for wafers with a diameter of 300 mm are provided. Further, as cassettes with different capacities, a small cassette capable of receiving 13 wafers and a large cassette capable of receiving 25 wafers are provided. As the shape of the cassette, an open-type cassette in which the eject port used to remove a wafer from the cassette is open and an integral-type cassette in which the eject port is covered with an open/close door are provided.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

A conventional frame cassette load port only supports one cassette at a time, and one cassette only support thirteen wafers inside (weight concern for operator hand carry), so it needs a lot of loading/unloading time to swap cassette. This situation will reduce tool productivity of some processing tools having high throughput processes. This kind of processing tools need more load ports and will cause more costs and fabrication space. Therefore, to provide a load port and a method for loading and unloading a cassette to solve the above-mentioned problems becomes an important issue to be solved by those in the industry.

The disclosure can respectively buffer a plurality of cassettes in a plurality of cassette buffering spaces of a carrier, such that the capacity of the load port can be increased. Under the configuration, an operator can sequentially load the cassettes into the load port and then wait the processing tool to process wafers in the cassettes, and after all of the wafers in the cassettes have been processed, the operator can sequentially unload the cassettes out of the load port. Therefore, not only the capacity of the load port is increased, the time interval between loading and unloading the cassettes is also increased, such that the productivity of the processing tool and the efficiency of the operator can be improved.

Figure 1:
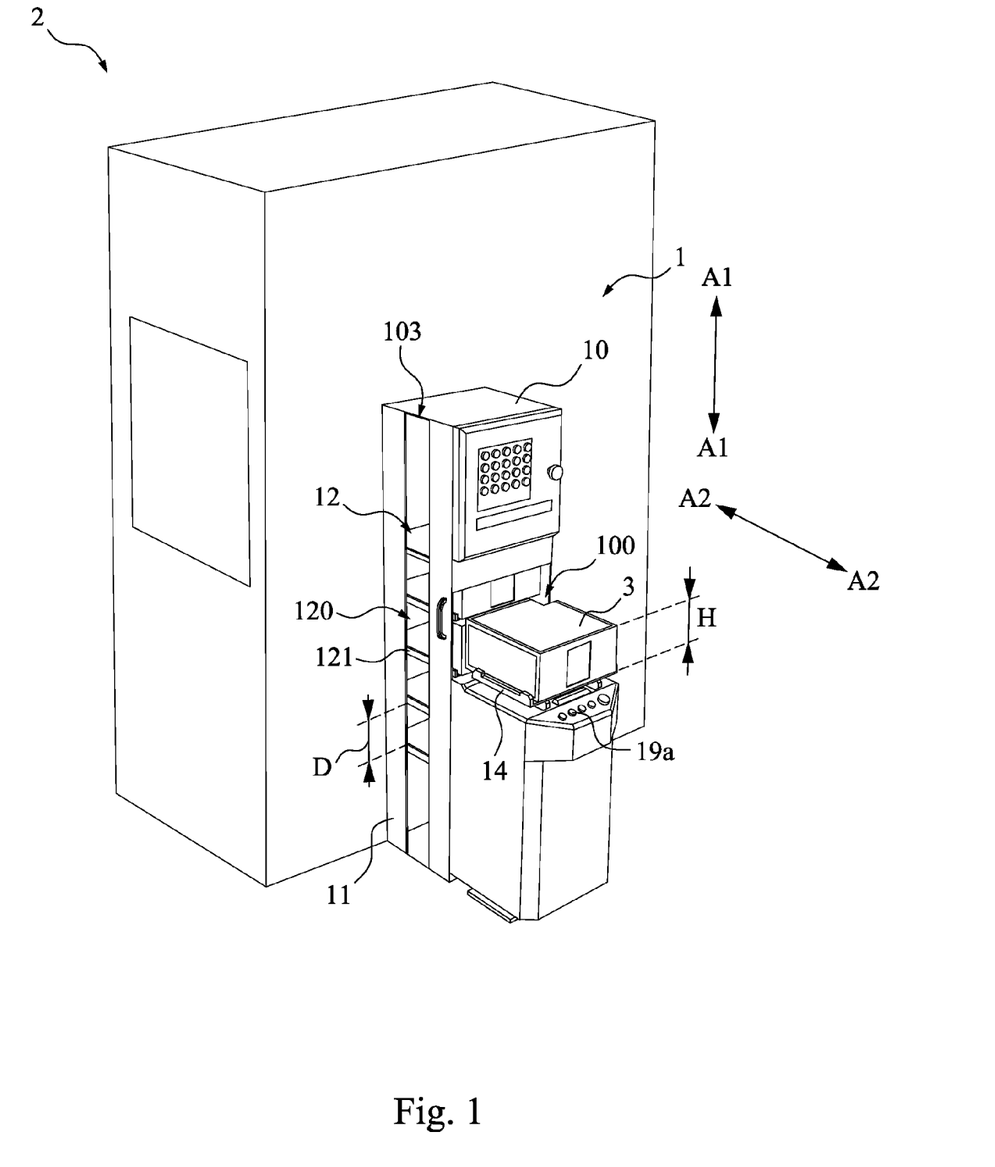
FIG. 1 is a perspective view of a load port for a processing tool according to some embodiments of the present disclosure.
Figure 2:
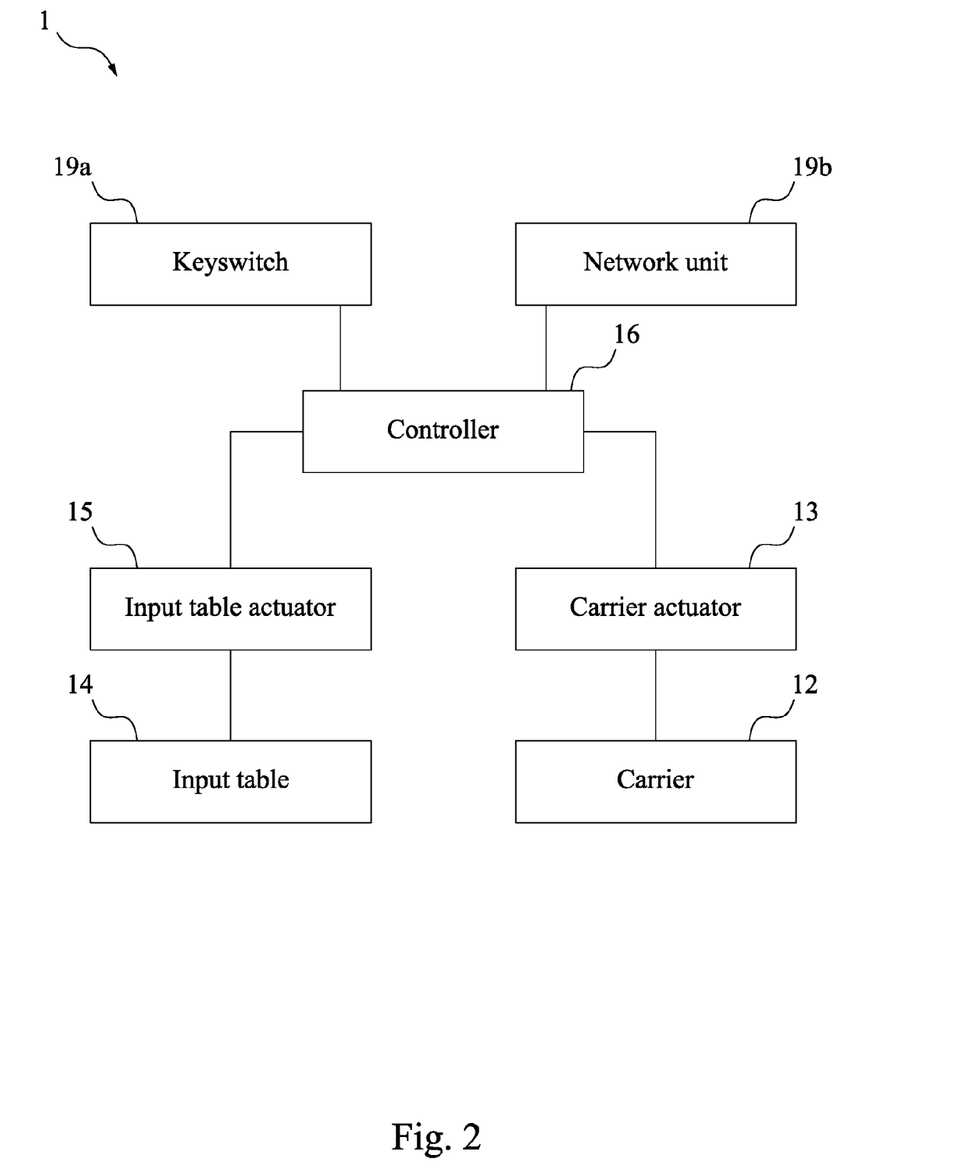
FIG. 2 is a schematic diagram of the load port in FIG. 1 according to some embodiments of the present disclosure.

FIG. 1 is a perspective view of a load port 1 for a processing tool 2 according to some embodiments of the present disclosure. FIG. 2 is a schematic diagram of the load port 1 in FIG. 1 according to some embodiments of the present disclosure.

As shown in FIG. 1 and FIG. 2, the load port 1 includes a carrier 12, a carrier actuator 13, an input table 14, an input table actuator 15, and a controller 16. The carrier 12 has a plurality of cassette buffering spaces 120. The carrier 12 is movable relative to the processing tool 2. The carrier actuator 13 is operably connected to the carrier 12. The input table 14 is configured to receive at least one cassette 3. The input table 14 is movable relative to the carrier 12. The input table actuator 15 is operably connected to the input table 14. The controller 16 is configured to control the carrier actuator 13 to move the carrier 12, such that one of the cassette buffering spaces 120 is aligned with the input table 14. The controller 16 is configured to control the input table actuator 15 to move the input table 14 with the cassette 3 into the aligned cassette buffering space 120. The controller 16 is configured to control the input table 14 to load the cassette 3 into the aligned cassette buffering space 120.

From a different perspective, the carrier 12 includes a plurality of cassette supporting plates 121, and the cassette buffering spaces 120 are respectively defined over the cassette supporting plates 121. The carrier 12 is movable relative to the processing tool 2 along a first direction A1. The cassette supporting plates 121 are arranged along the first direction A1. Any two adjacent cassette supporting plates 121 are separated by a distance D along first the direction. The carrier actuator 13 is operably connected to the carrier 12. The input table 14 is configured to receive at least one cassette 3. The input table 14 is movable relative to the cassette supporting plates 121 along a second direction A2 different from the first direction A1. A height H of the cassette 3 is smaller than the distance D, so as to be received in the space between any two adjacent cassette supporting plates 121. The input table actuator 15 is operably connected to the input table 14. The controller 16 is configured to control the carrier actuator 13 to move the carrier 12, such that one of the cassette supporting plates 121 is aligned with the input table 14. The controller 16 is configured to control the input table actuator 15 to move the input table 14 with the cassette 3 on the aligned cassette supporting plate 121. The controller 16 is configured to control the input table 14 to load the cassette 3 onto the aligned cassette supporting plate 121.

In some embodiments, the first direction A1 is substantially perpendicular to the second direction A2, but the disclosure is not limited in this regard.

Moreover, the controller 16 is further configured to control the input table 14 to unload the cassette 3 from the aligned cassette buffering space 120, and configured to control the input table actuator 15 to move the input table 14 with the cassette 3 out of the aligned cassette buffering space 120.

From a different perspective, the controller 16 is further configured to control the input table 14 to unload the cassette 3 from the aligned cassette supporting plate 121, and configured to control the input table actuator 15 to move the input table 14 with the cassette 3 out of the aligned cassette supporting plate 121.

In some embodiments, the number of the cassette receiving spaces of the carrier 12 is four, but the disclosure is not limited in this regard. As a result, the capacity of loading/unloading cassettes 3 of the load port 1 in FIG. 1 is equal to the capacity of four conventional load ports, but the footage of the load port 1 in FIG. 1 is smaller than that of the four conventional load ports, so that fabrication space can be efficiently used.

As shown in FIG. 1, the load port 1 further includes a housing 10. The housing 10 has an input gateway 100 facing the input table 14. The carrier 12 is movably disposed in the housing 10, and the input table 14 is movable into and out of the aligned cassette buffering space 120 via the input gateway 100.

Figure 3:
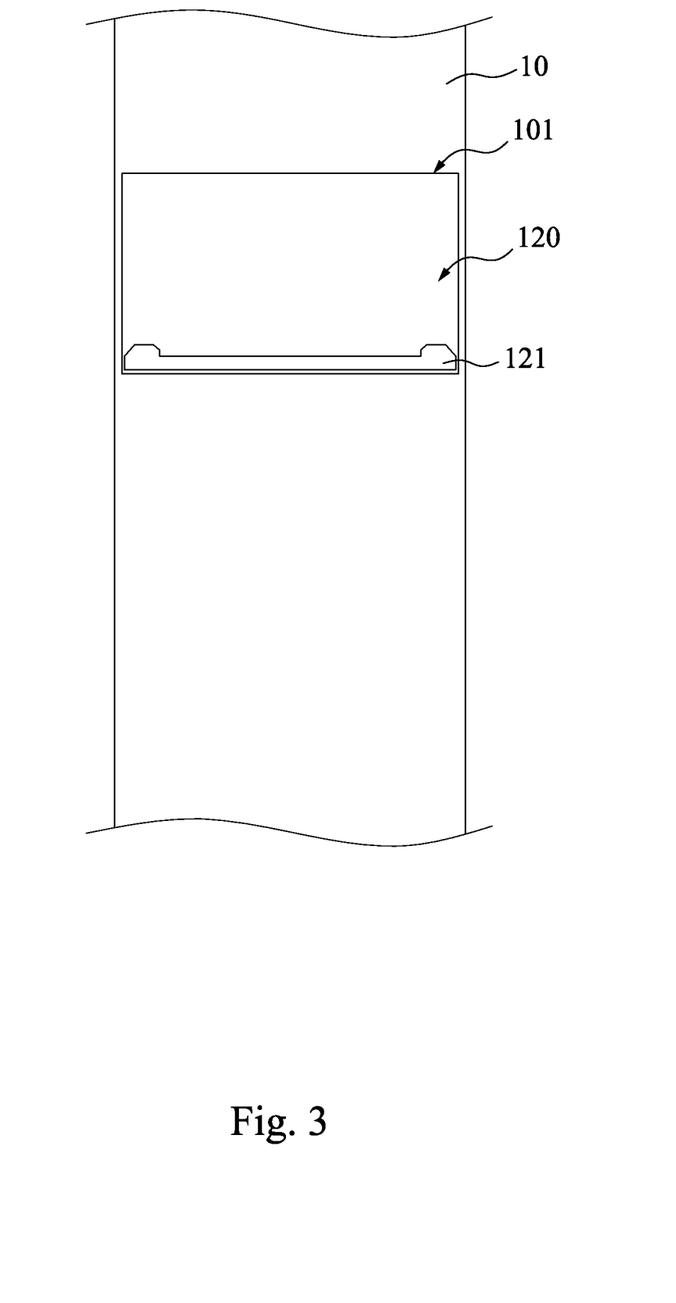
FIG. 3 is a rear view of a housing of the load port in FIG. 1 according to some embodiments of the present disclosure.

FIG. 3 is a rear view of a housing 10 of the load port 1 in FIG. 1 according to some embodiments of the present disclosure.

As shown in FIG. 1 and FIG. 3, the housing 10 further has a processing gateway 101 facing the processing tool 2, and the input gateway 100 and the processing gateway 101 are respectively located at opposite sides of the housing 10.

As shown in FIG. 1, the housing 10 has a doorway 103 to the carrier 12. The load port 1 further includes a door 11 pivotally connected to the housing 10 and capable of selectively opening and closing the doorway 103. Specifically, the doorway 103 and the processing gateway 101 are respectively located at adjacent sides of the housing 10. In more detailed, the doorway 103 is located at the same side of the input gateway 100 and the processing gateway 101. As a result, when the load port 1 malfunctions, the cassettes 3 received in the carrier can be taken out via the doorway 103 by opening the door 11.

As shown in FIG. 1 and FIG. 2, the load port 1 further includes a plurality of keyswitches 19a respectively corresponding to the cassette buffering spaces 120. The controller 16 is further configured to operate based on a pressed signal generated by any of the keyswitches 19a. For example, when a cassette 3 is placed on the input table 14 and one of the buttons is pressed, the controller 16 will control the carrier actuator 13 to move the carrier 12, such that the cassette buffering space 120 corresponding to the pressed button is aligned with the input table 14, control the input table actuator 15 to move the input table 14 with the cassette 3 into the aligned cassette buffering space 120, and then control the input table 14 to load the cassette 3 into the aligned cassette buffering space 120.

On the other hand, when a cassette 3 is received in one of the cassette buffering spaces 120 and the button corresponding to the cassette buffering space 120 receiving the placed cassette 3 is pressed, the controller 16 will control the carrier actuator 13 to move the carrier 12, such that the cassette buffering space 120 receiving the cassette 3 is aligned with the input table 14, control the input table actuator 15 to move the input table 14 into the cassette buffering space 120 receiving the cassette 3, and then control the input table 14 to unload the cassette 3 from the cassette buffering space 120 receiving the cassette 3.

As shown in FIG. 2, the load port 1 further includes a network unit 19b configured to receive a remote control signal. The controller 16 is further configured to operate based on the remote control signal.

Figure 4:
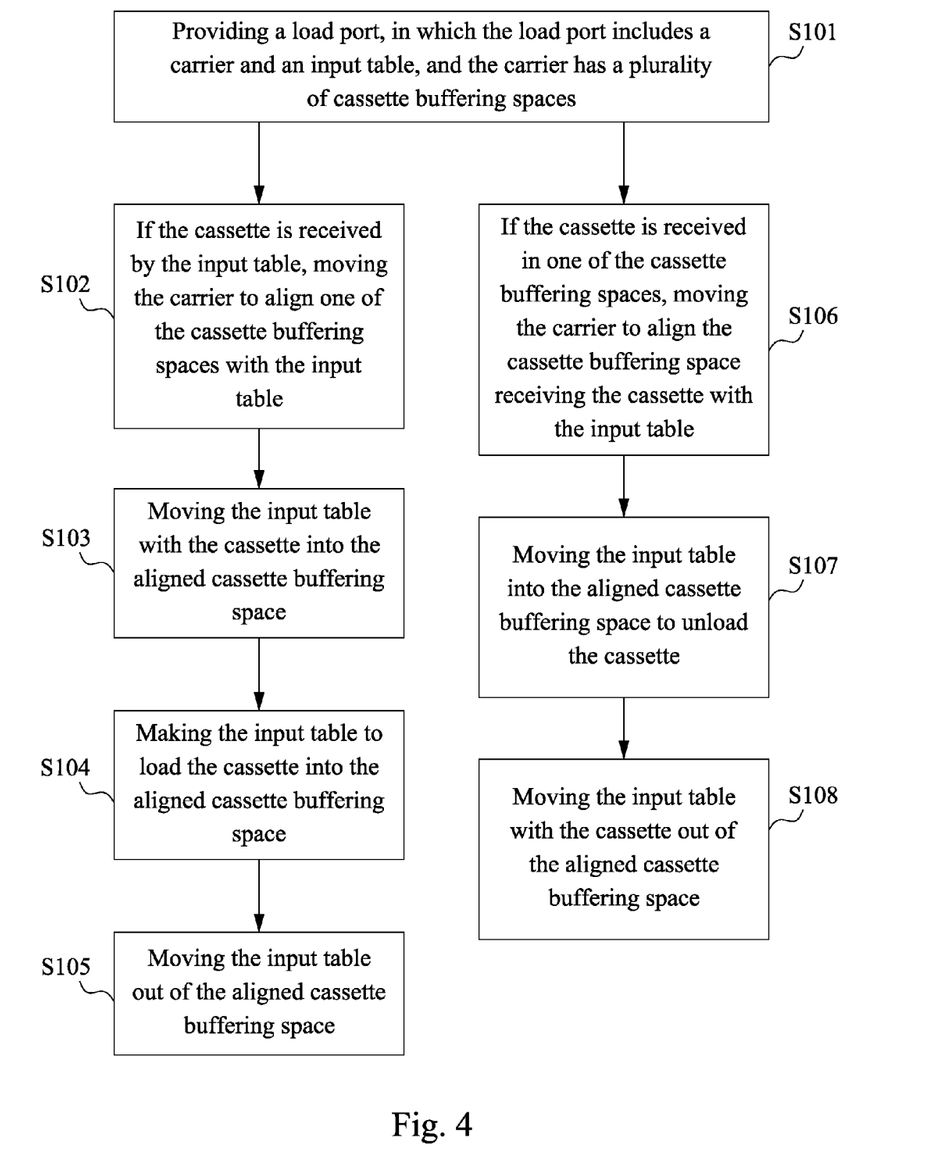
FIG. 4 is a flow chart of a method for loading and unloading a cassette according to some embodiments of the present disclosure.

FIG. 4 is a flow chart of a method for loading and unloading a cassette according to some embodiments of the present disclosure.

As shown in FIG. 4, with reference to FIG. 1 and FIG. 2, the method for loading and unloading a cassette includes steps S101-S108 shown below. It is noted that steps S102-S105 can be performed to load a cassette 3.

In step S101, a load port 1 is provided, in which the load port 1 includes a carrier 12 and an input table 14, and the carrier 12 has a plurality of cassette buffering spaces 120. Thereafter in step S102, if the cassette 3 is received by the input table 14, the carrier 12 is moved to align one of the cassette buffering spaces 120 with the input table 14. Thereafter in step S103, the input table 14 with the cassette 3 is moved into the aligned cassette buffering space 120. Thereafter in step S104, the input table 14 loads the cassette 3 into the aligned cassette buffering space 120. Finally in step S105, the input table 14 is moved out of the aligned cassette buffering space 120.

On the other hand, it is noted that steps S106-S108 can be performed to unload the cassette 3.

In step S106, if the cassette 3 is received in one of the cassette buffering spaces 120, the carrier 12 is moved to align the cassette buffering space 120 receiving the cassette 3 with the input table 14. Thereafter in step S107, the input table 14 is moved into the aligned cassette buffering space 120 to unload the cassette 3. Finally in step S108, the input table 14 with the cassette 3 is moved out of the aligned cassette buffering space 120.

Figure 5:
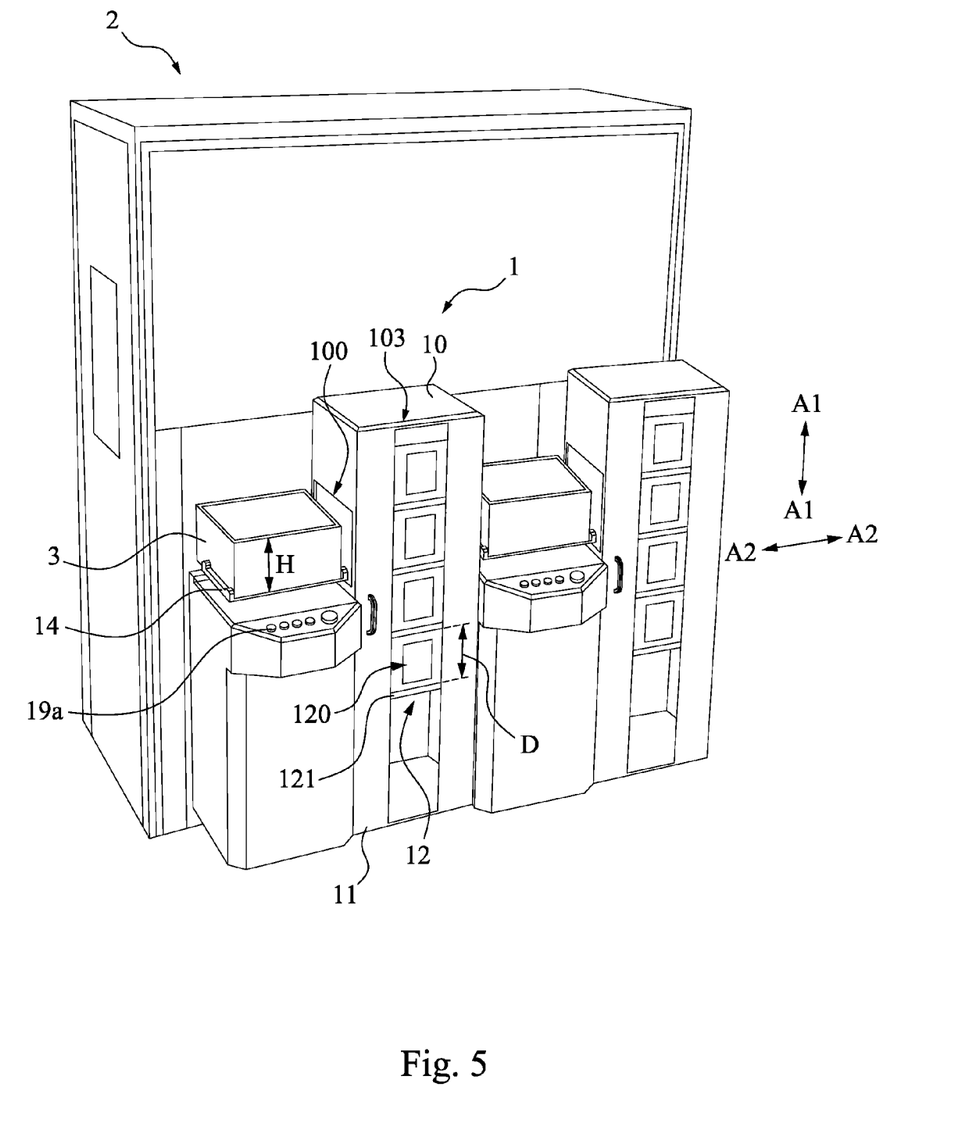
FIG. 5 is a perspective view of two load ports for a processing tool according to some other embodiments of the present disclosure.

FIG. 5 is a perspective view of two load ports 1 for a processing tool 2 according to some other embodiments of the present disclosure.

As shown in FIG. 5, it can be seen that there are two load ports 1 installed side by side in front of the processing tool 2. Each of the load ports 1 also includes a housing 10, a door 11, a carrier 12, a carrier actuator 13, an input table 14, an input table actuator 15, a controller 16, a plurality of keyswitches 19a, and a network unit 19b, so the functions of the components and the connection relationships among them can be referred to the above related descriptions and are not repeated again here.

Compared with the housing 10 of the load port 1 in FIG. 1, the housing 10 of each of the load ports 1 in FIG. 3 is configured that the input gateway 100 and the processing gateway 101 are respectively located at adjacent sides of the housing 10, and the doorway 103 and the processing gateway 101 are respectively located at opposite sides of the housing 10. Similarly, when the load port 1 malfunctions, the cassettes 3 received in the carrier can be taken out via the doorway 103 by opening the door 11.

Under the configuration, the two load ports 1 in FIG. 5 can totally buffer at most eight cassettes 3. That is, the capacity of loading/unloading cassettes 3 of the load ports 1 in FIG. 5 is double the capacity of four conventional load ports, but the footage of the load ports 1 in FIG. 5 is equal to that of the four conventional load ports, so that fabrication space can be efficiently used.

However, the disclosure is not limited in this regard. In practical applications, the number the installed load ports 1 for the processing tool 2 can be adjusted according to actual requirements or spatial limitations.

Figure 6:
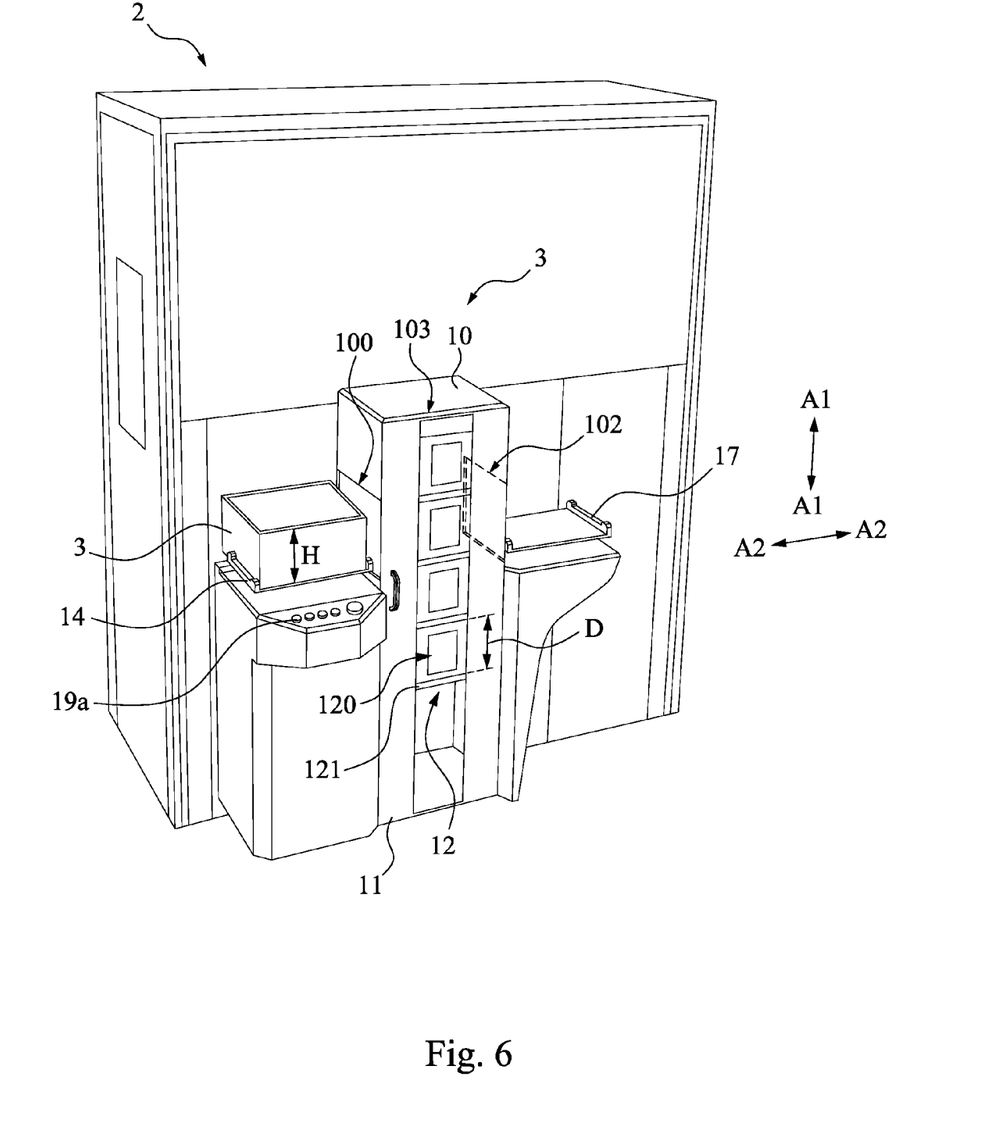
FIG. 6 is a perspective view of a load port for a processing tool according to some other embodiments of the present disclosure.
Figure 7:
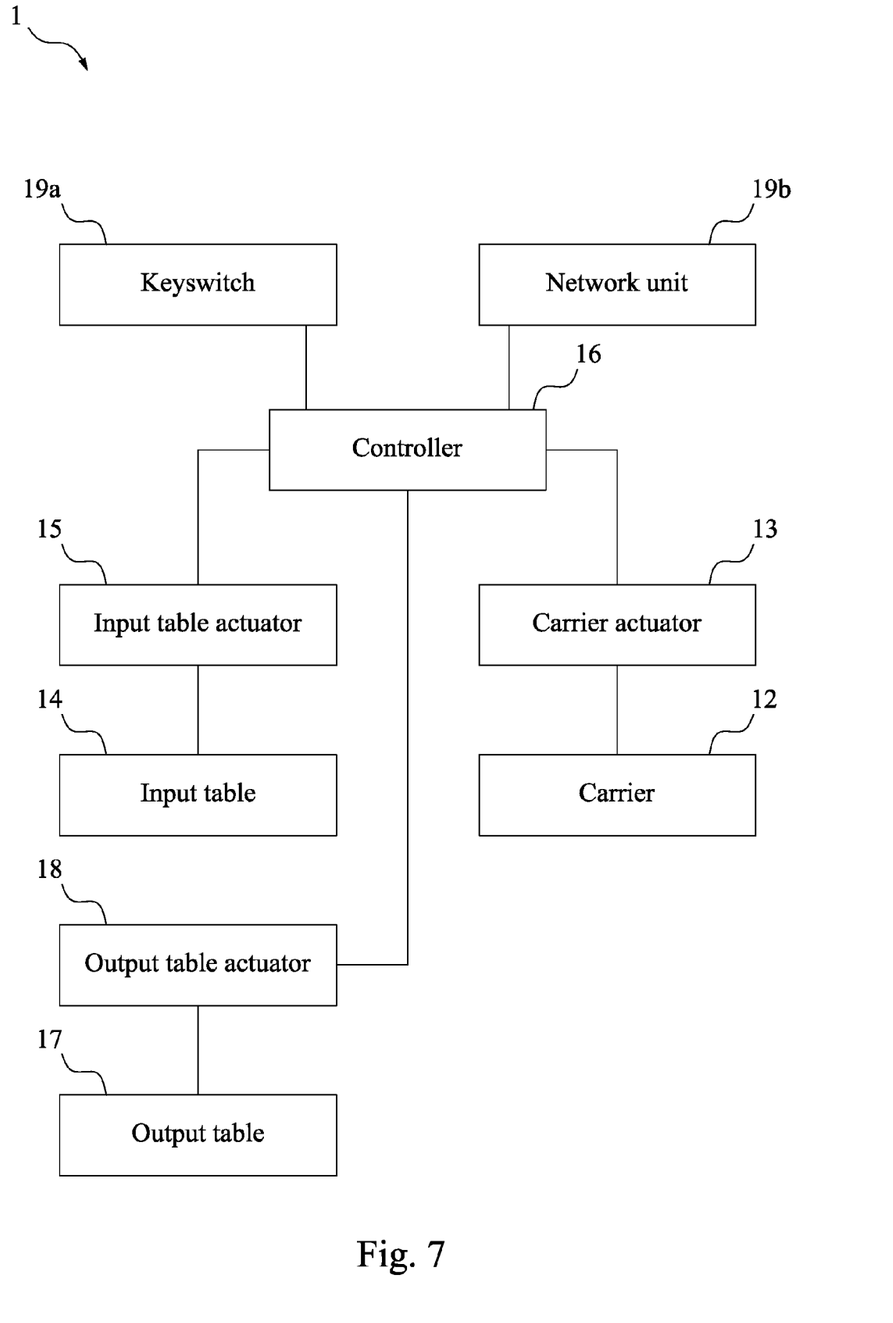
FIG. 7 is a schematic diagram of the load port in FIG. 6 according to some embodiments of the present disclosure.

FIG. 6 is a perspective view of a load port 1 for a processing tool 2 according to some other embodiments of the present disclosure. FIG. 7 is a schematic diagram of the load port 1 in FIG. 6 according to some embodiments of the present disclosure.

As shown in FIG. 6 and FIG. 7, the load port 1 also includes a housing 10, a door 11, a carrier 12, a carrier actuator 13, an input table 14, an input table actuator 15, a controller 16, a plurality of keyswitches 19a, and a network unit 19b, so the functions of the components and the connection relationships among them can be referred to the above related descriptions and are not repeated again here.

Compared with the load port 1 in FIG. 1 and that in FIG. 3, the load port 1 in FIG. 6 and FIG. 7 further includes an output table 17 and an output table actuator 18. The housing 10 has an output gateway 102 facing the output table 17. The output table 17 is movable relative to the carrier 12. The output table actuator 18 is operably connected to the output table 17. The controller 16 is further configured to control the carrier actuator 13 to move the carrier 12, such that one of the cassette buffering spaces 120 is aligned with the output table 17. The controller 16 is further configured to control the output table actuator 18 to move the output table 17 into the cassette buffering space 120 aligned with the output table 17. The controller 16 is further configured to control the output table 17 to unload the cassette 3 from the cassette buffering space 120 aligned with the output table 17.

For example, when a cassette 3 is placed on the input table 14 and one of the buttons is pressed, the controller 16 will control the carrier actuator 13 to move the carrier 12, such that the cassette buffering space 120 corresponding to the pressed button is aligned with the input table 14, control the input table actuator 15 to move the input table 14 with the cassette 3 into the aligned cassette buffering space 120, and then control the input table 14 to load the cassette 3 into the aligned cassette buffering space 120.

On the other hand, when a cassette 3 is received in one of the cassette buffering spaces 120 and the button corresponding to the cassette buffering space 120 receiving the placed cassette 3 is pressed, the controller 16 will control the carrier actuator 13 to move the carrier 12, such that the cassette buffering space 120 receiving the cassette 3 is aligned with the output table 17, control the output table actuator 18 to move the output table 17 into the cassette buffering space 120 receiving the cassette 3, and then control the output table 17 to unload the cassette 3 from the cassette buffering space 120 receiving the cassette 3.

Under the configuration, the load port 1 in FIG. 6 can totally buffer at most five cassettes 3 (four cassettes 3 are buffered in the carrier 12 and one cassette 3 is buffered on the output table 17). That is, the capacity of loading/unloading cassettes 3 of the load port 1 in FIG. 6 is larger than the capacity of three conventional load ports, but the footage of the load port 1 in FIG. 6 is equal to that of the three conventional load ports, so that fabrication space can be efficiently used.

Figure 8:
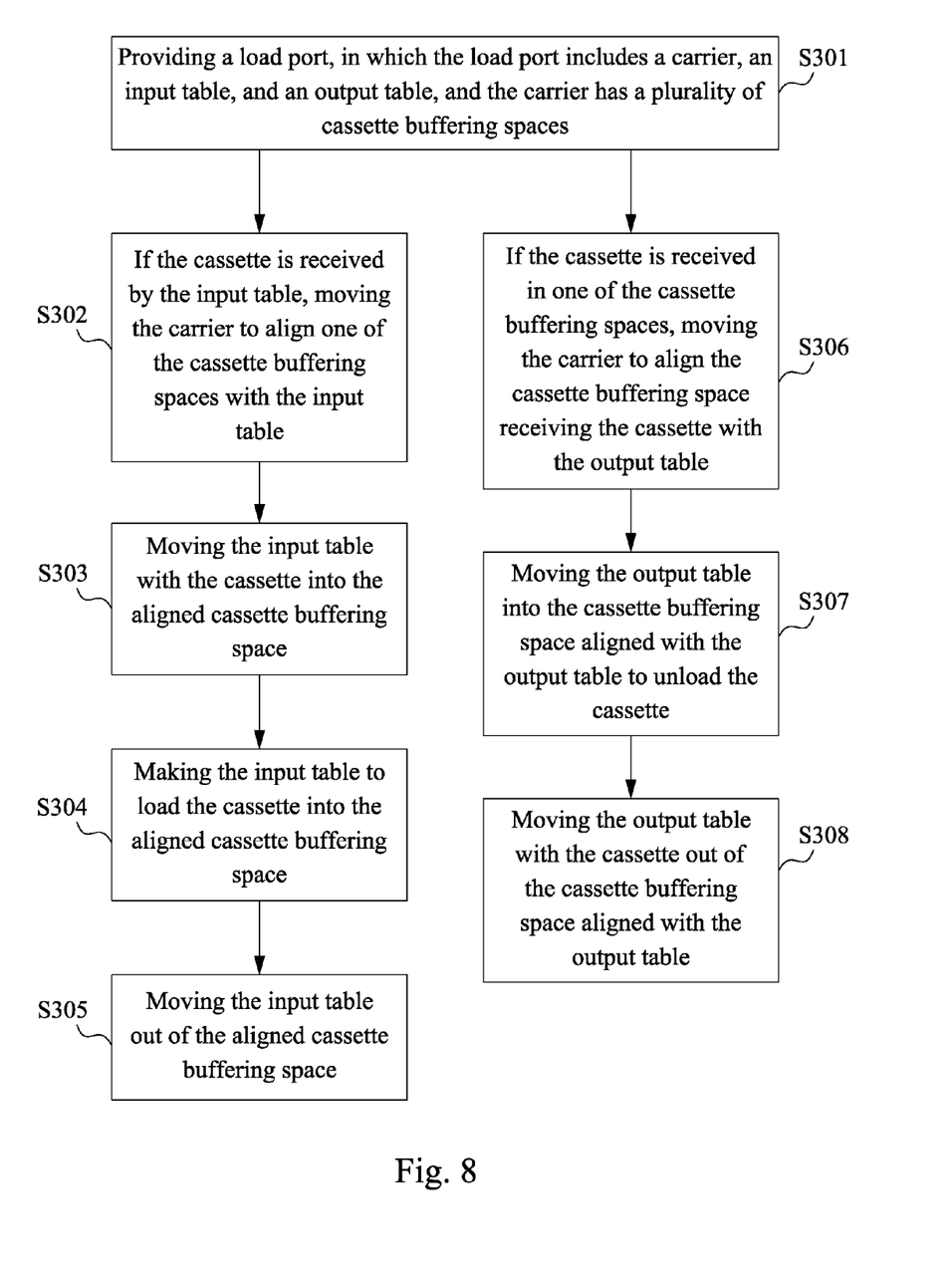
FIG. 8 is a flow chart of a method for loading and unloading a cassette according to some other embodiments of the present disclosure.

FIG. 8 is a flow chart of a method for loading and unloading a cassette according to some other embodiments of the present disclosure.

As shown in FIG. 8, with reference to FIG. 6 and FIG. 7, the method for loading and unloading a cassette includes steps S301-S308 shown below. It is noted that steps S302-S305 can be performed to load a cassette 3.

In step S301, a load port 1 is provided, in which the load port 1 comprises a carrier 12, an input table 14, and an output table 17, and the carrier 12 has a plurality of cassette buffering spaces 120. Thereafter in step S302, if the cassette 3 is received by the input table 14, the carrier 12 is moved to align one of the cassette buffering spaces 120 with the input table 14. Thereafter in step S303, the input table 14 with the cassette 3 is moved into the aligned cassette buffering space 120. Thereafter in step S304, the input table 14 loads the cassette 3 into the aligned cassette buffering space 120. Finally in step S305, the input table 14 is moved out of the aligned cassette buffering space 120.

On the other hand, it is noted that S306-S308 can be performed to unload the cassette 3.

In step S306, if the cassette 3 is received in one of the cassette buffering spaces 120, the carrier 12 is moved to align the cassette buffering space 120 receiving the cassette 3 with the output table 17. Thereafter in step S307, the input table 14 is moved into the cassette buffering space 120 aligned with the output table 17 to unload the cassette 3. Finally in step S308, the output table 17 with the cassette 3 is moved out of the cassette buffering space 120 aligned with the output table 17.

According to the foregoing recitations of the embodiments of the disclosure, it can be seen that the load port of the disclosure can buffer a plurality of cassettes in a plurality of cassette buffering spaces of a carrier, such that the capacity of the load port can be increased. Under the configuration, an operator can sequentially load the cassettes into the load port and then wait the processing tool to process wafers in the cassettes, and after all of the wafers in the cassettes have been processed, the operator can sequentially unload the cassettes out of the load port. Therefore, not only the capacity of the load port is increased, the time interval between loading and unloading the cassettes is also increased, such that the productivity of the processing tool and the efficiency of the operator can be improved. Moreover, compared with conventional load ports, the number of the installed load ports of the disclosure can be reduced to load or unload same number of cassettes, so that costs and fabrication space can be reduced.

According to some embodiments, a load port for a processing tool is provided. The load port includes a carrier, a carrier actuator, an input table, an input table actuator, and a controller. The carrier has a plurality of cassette buffering spaces. The carrier is movable relative to the processing tool. The carrier actuator is operably connected to the carrier. The input table is configured to receive at least one cassette. The input table is movable relative to the carrier. The input table actuator is operably connected to the input table. The controller is configured to control the carrier actuator to move the carrier, such that one of the cassette buffering spaces is aligned with the input table. The controller is configured to control the input table actuator to move the input table with the cassette into the aligned cassette buffering space. The controller is configured to control the input table to load the cassette into the aligned cassette buffering space.

According to some embodiments, a load port for a processing tool is provided. The load port includes a carrier, a carrier actuator, an input table, an input table actuator, and a controller. The carrier includes a plurality of cassette supporting plates. The carrier is movable relative to the processing tool along a first direction. The cassette supporting plates are arranged along the first direction. Any two adjacent cassette supporting plates are separated by a distance along first the direction. The carrier actuator is operably connected to the carrier. The input table is configured to receive at least one cassette. The input table is movable relative to the cassette supporting plates along a second direction different from the first direction. A height of the cassette is smaller than the distance. The input table actuator is operably connected to the input table. The controller is configured to control the carrier actuator to move the carrier, such that one of the cassette supporting plates is aligned with the input table. The controller is configured to control the input table actuator to move the input table with the cassette on the aligned cassette supporting plate. The controller is configured to control the input table to load the cassette onto the aligned cassette supporting plate.

According to some embodiments, a method for loading and unloading a cassette is provided. The method includes: providing a load port, in which the load port includes a carrier and an input table, and the carrier has a plurality of cassette buffering spaces; receiving the cassette with the input table; moving the carrier to align one of the cassette buffering spaces with the input table; moving the input table with the cassette into the aligned cassette buffering space; and making the input table to load the cassette into the aligned cassette buffering space.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A load port for a processing tool, the load port comprising:

a carrier having a plurality of cassette buffering spaces, the carrier being movable relative to the processing tool;

a carrier actuator operably connected to the carrier;

an input table configured to receive at least one cassette, the input table being movable relative to the carrier;

an input table actuator operably connected to the input table;

a housing having a processing gateway facing the processing tool, the housing having a compartment in which the carrier is movably disposed, wherein the processing tool, the processing gateway, the compartment, and the input table are aligned in a linear direction, and a bottom of the processing gateway is in a higher position than a bottom of the compartment; and a controller configured to control the carrier actuator to move the carrier, such that one of the cassette buffering spaces is aligned with the input table, configured to control the input table actuator to move the input table with the at least one cassette into the aligned cassette buffering space, and configured to control the input table to load the at least one cassette into the aligned cassette buffering space.

2. The load port of claim 1, wherein the controller is further configured to control the input table to unload the at least one cassette from the aligned cassette buffering space, and configured to control the input table actuator to move the input table with the at least one cassette out of the aligned cassette buffering space.

3. The load port of claim 1, wherein the housing has an input gateway facing the input table, and the input table is movable into and out of the aligned cassette buffering space via the input gateway.

4. The load port of claim 3, wherein the input gateway and the processing gateway are respectively located at opposite sides of the housing.

5. The load port of claim 1, wherein the housing has a doorway to the carrier; and further comprising a door pivotally connected to the housing and capable of selectively opening and closing the doorway.

6. The load port of claim 5, wherein the doorway and the processing gateway are respectively located at adjacent sides of the housing.

7. The load port of claim 1, further comprising a plurality of keyswitches respectively corresponding to the cassette buffering spaces, and the controller is further configured to operate based on a pressed signal generated by any of the keyswitches.

8. The load port of claim 1, further comprising a network unit configured to receive a remote control signal, and the controller is further configured to operate based on the remote control signal.

9. The load port of claim 1, wherein the carrier has a plurality of cassette supporting plates, and at least one of the cassette supporting plates is moveable to a lower position than the bottom of the processing gateway.

10. The load port of claim 1, wherein the input table is located out of the housing.

11. A load port for a processing tool, the load port comprising:

a carrier comprising a plurality of cassette supporting plates, the carrier being movable relative to the processing tool along a first direction, wherein the cassette supporting plates are arranged along the first direction, and any two adjacent cassette supporting plates are separated by a distance along the first direction;

a carrier actuator operably connected to the carrier;

an input table configured to receive at least one cassette, the input table being movable relative to the cassette supporting plates along a second direction different from the first direction, wherein a height of the at least one cassette is smaller than the distance;

an input table actuator operably connected to the input table;

a housing having a processing gateway facing the processing tool, wherein the housing has a compartment in which the carrier is movably disposed, and a bottom of the processing gateway is disposed over a bottom of the compartment; and a controller configured to control the carrier actuator to move the carrier, such that one of the cassette supporting plates is aligned with the input table, configured to control the input table actuator to move the input table with the at least one cassette on the aligned cassette supporting plate, and configured to control the input table to load the at least one cassette onto the aligned cassette supporting plate.

12. The load port of claim 11, wherein the controller is further configured to control the input table to unload the at least one cassette from the aligned cassette supporting plate, and configured to control the input table actuator to move the input table with the at least one cassette out of the aligned cassette supporting plate.

13. The load port of claim 11, further comprising:

an output table movable relative to the cassette supporting plates; and an output table actuator operably connected to the output table, wherein the controller is further configured to control the carrier actuator to move the carrier, such that one of the cassette supporting plates is aligned with the output table, configured to control the output table actuator to move the output table on the cassette supporting plate aligned with the output table, and configured to control the output table to unload the at least one cassette from the cassette supporting plate aligned with the output table.

14. The load port of claim 11, wherein the first direction is substantially perpendicular to the second direction.

15. The load port of claim 11, wherein the processing tool, the compartment, and the input table are aligned in a linear direction.

16. The load port of claim 11, wherein at least one of the cassette supporting plates is moveable to a lower position than the bottom of the processing gateway.

17. The load port of claim 11, wherein the housing has an input gateway facing the input table.

18. The load port of claim 17, wherein the input gateway and the processing gateway are respectively located at opposite sides of the housing.

19. A load port for a processing tool, the load port comprising:

a carrier having a plurality of cassette buffering spaces, the carrier being configured to be located in front of a surface of the processing tool, and being movable relative to the processing tool along a path substantially parallel to the surface;

a carrier actuator operably connected to the carrier;

an input table configured to receive at least one cassette, the input table being configured to selectively move toward or away from the carrier;

an input table actuator operably connected to the input table;

a housing having a processing gateway facing the processing tool, wherein the housing has a compartment in which the carrier is movably disposed, and a bottom of the processing gateway is disposed over a bottom of the compartment; and a controller configured to control the carrier actuator to move the carrier to align one of the cassette buffering spaces with the input table, configured to control the input table actuator to move the input table with the at least one cassette into the aligned cassette buffering space, and configured to control the input table to load the at least one cassette into the aligned cassette buffering space.

20. The load port of claim 19, wherein the path is substantially straight.

* * * * *